United States Patent [19]

Jasberg et al.

[11] Patent Number: 5,039,890
[45] Date of Patent: Aug. 13, 1991

[54] INTEGRATABLE FILTER CIRCUIT

[75] Inventors: Hartmut Jasberg, Ottobrunn; Ulrich Lachmann, Munich, both of Fed. Rep. of Germany

[73] Assignee: Siemens Aktiengesellschaft, Munich, Fed. Rep. of Germany

[21] Appl. No.: 420,354

[22] Filed: Oct. 12, 1989

[30] Foreign Application Priority Data

Oct. 13, 1988 [EP] European Pat. Off. .......... 88117046

[51] Int. Cl.⁵ .................. H03B 1/00; H03K 5/00
[52] U.S. Cl. ...................... 307/520; 328/167
[58] Field of Search ............ 307/520, 521, 246; 328/163, 165, 167; 330/257, 288, 107

[56] References Cited

U.S. PATENT DOCUMENTS

| | | | |
|---|---|---|---|
| 4,532,442 | 7/1985 | Black | 307/520 |
| 4,536,666 | 8/1985 | Metz et al. | 307/520 |
| 4,603,299 | 7/1986 | Monett | 307/246 |
| 4,687,998 | 8/1987 | Takatori et al. | 307/246 |
| 4,829,268 | 5/1989 | Leuthold et al. | 307/520 |
| 4,866,301 | 9/1989 | Smith | 307/246 |
| 4,918,338 | 4/1990 | Wong | 328/167 |

Primary Examiner—Timothy P. Callahan
Attorney, Agent, or Firm—Herbert L. Lerner; Laurence A. Greenberg

[57] ABSTRACT

A filter circuit suitable for integration has first and second voltage/current converters. A signal source is coupled to the first voltage/current converter. A capacitor is coupled to the second voltage/current converter. An amplifier is coupled to the capacitor and has an output forming a filter output. The voltage/current converters have outputs fed to the capacitor in phase opposition to one another.

6 Claims, 1 Drawing Sheet

INTEGRATABLE FILTER CIRCUIT

The invention relates to an integratable filter circuit.

Integrated circuits for analog signal processing often include filter circuits for suppressing undesirable disturbance variables. Very often, first-order low-pass filters, such as for damping high-frequency disturbance components, and first-order high-pass filters for filtering out offset variables, are used. The filter circuits are constructed in such a way that the least possible circuitry expense is needed for setting the limit frequency. Since inductive resistors and capacitors, particularly for the low-frequency range, have only been attainable with great difficulty, if at all, because of their high inductance and capacitance, and because inductive resistors generally can be more markedly influenced by disturbance fields, external capacitors are typically used as elements for limit frequency setting.

When used in combination with integrated ohmic resistors, the external capacitors form RC elements, which are used either directly, as a passive filter circuit, or as an active filter circuit in the feedback branch of an amplifier. Passive and active filter circuits are known, among other sources, from the publication entitled Halbleiter-Schaltungstechnik [Semiconductor Circuitry] by Tietze and Schenk, 5th Edition, 1980, pp. 9-17 and 290-292. For a given RC element, the resistance and/or capacitance increases with decreasing limit frequency. Since the resistances can only be increased to a limited extent in an integrated circuit, the result for the external capacitors is high capacitances at low limit frequencies.

However, in many applications, capacitors of relatively high capacitance are unavailable, or are unsuitable because of their external dimensions. For instance, ceramic capacitors are predominantly used in automobile electronics, because of the wide temperature range encountered. However, they only have a relatively narrow capacitance range.

It is accordingly an object of the invention to provide an integratable filter circuit, which overcomes the hereinafore-mentioned disadvantages of the heretofore-known devices of this general type and in which lower capacitances are needed for setting the limit frequency.

With the foregoing and other objects in view there is provided, in accordance with the invention, an integratable filter circuit, comprising a first voltage/current converter, a signal source coupled to the first voltage/current converter, a second voltage/current converter, a capacitor coupled to the second voltage/current converter, and an amplifier being coupled to the capacitor and having an output forming a filter output, the voltage/current converters having outputs fed to the capacitor in phase opposition to one another.

In accordance with another feature of the invention, there is provided a subtracting amplifier coupled to the capacitor and to the signal source, the subtracting amplifier having an output forming a further filter output.

In accordance with a further feature of the invention, the first voltage/current converter is constructed as a voltage-controlled current source, and the second voltage-controlled current converter is constructed as a voltage-controlled current sink.

In accordance with an added feature of the invention, the voltage-controlled current source includes a first differential amplifier having an output side and a first current mirror connected to the output side of the first differential amplifier; the voltage-controlled current sink includes a second differential amplifier with an output side and a second current mirror connected to the output side of the second differential amplifier; the first differential amplifier and the second current mirror having transistors of one conduction type; and the second differential amplifier and the first current mirror having transistors of the other conduction type.

In accordance with an additional feature of the invention, there is provided a respective additional output branch for each of the current mirrors, and a common output joined to the additional output branches.

In accordance with a concomitant feature of the invention, there is provided a diode connected to the output of the voltage-controlled current source in the conducting direction.

Other features which are considered as characteristic for the invention are set forth in the appended claims.

Although the invention is illustrated and described herein as embodied in an integratable filter circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
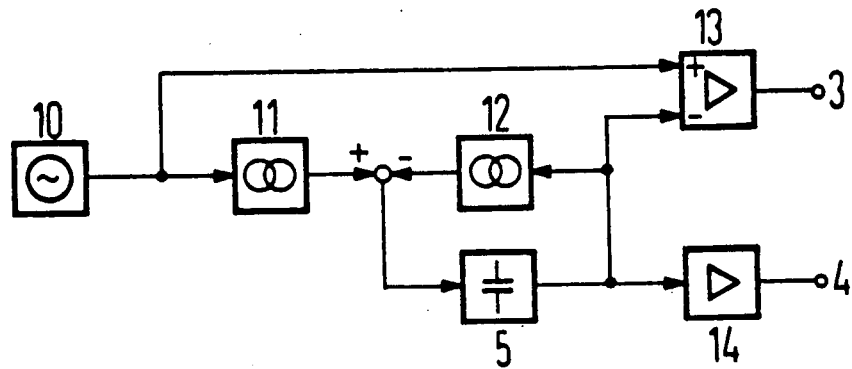
FIG. 1 is a block circuit diagram of a basic embodiment of a filter circuit according to the invention.

Referring now to the figures of the drawing in detail and first, particularly, to FIG. 1 thereof, there is seen a filter circuit according to the invention, in which a first voltage/current converter 11 coupled to a signal source 10 and a second voltage/current converter 12 coupled to a capacitor 5 are generally provided. The outputs of the two voltage/current converters 11, 12 are sent to the capacitor 5 in phase opposition to one another. The input of an amplifier 14 located on the output side of the capacitor 5 forms a first filter output 4. In the illustrated embodiment of the invention, the output of a subtracting amplifier 13, which has a non-inverting input connected to the signal source 10 and an inverting input connected to the capacitor 5, is provided as a second filter output 3.

Figure 2:
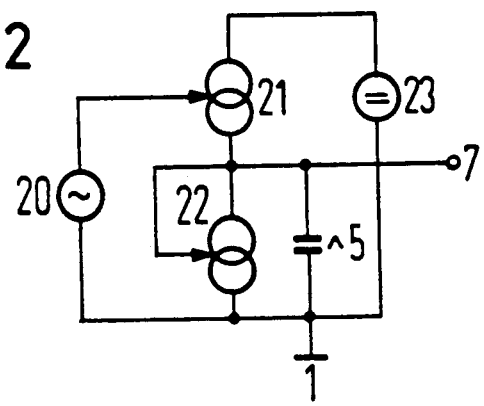
FIG. 2 is a schematic circuit diagram of an embodiment of the filter circuit of the invention having low-pass operation.

In the embodiment of FIG. 2, the first voltage/current converter 11 is constructed as a voltage-controlled current source 21, and the second voltage/current converter 12 is constructed as a voltage-controlled current sink 22. The voltage-controlled current sink 22 is connected in parallel with the capacitor 5, which has one terminal connected to reference potential 1 and the other terminal connected to a filter output 7. The control input of the voltage-controlled current sink 22 is also connected to the filter output 7. The voltage-controlled current source 21 has a control input which is acted upon by one pole of a signal source 20. The voltage-controlled current source 21 connects the filter output 7 to one pole of a supply voltage source 23. The other poles of the signal source 20 and the supply voltage source 23 are both connected to the reference potential 1.

Figure 3:
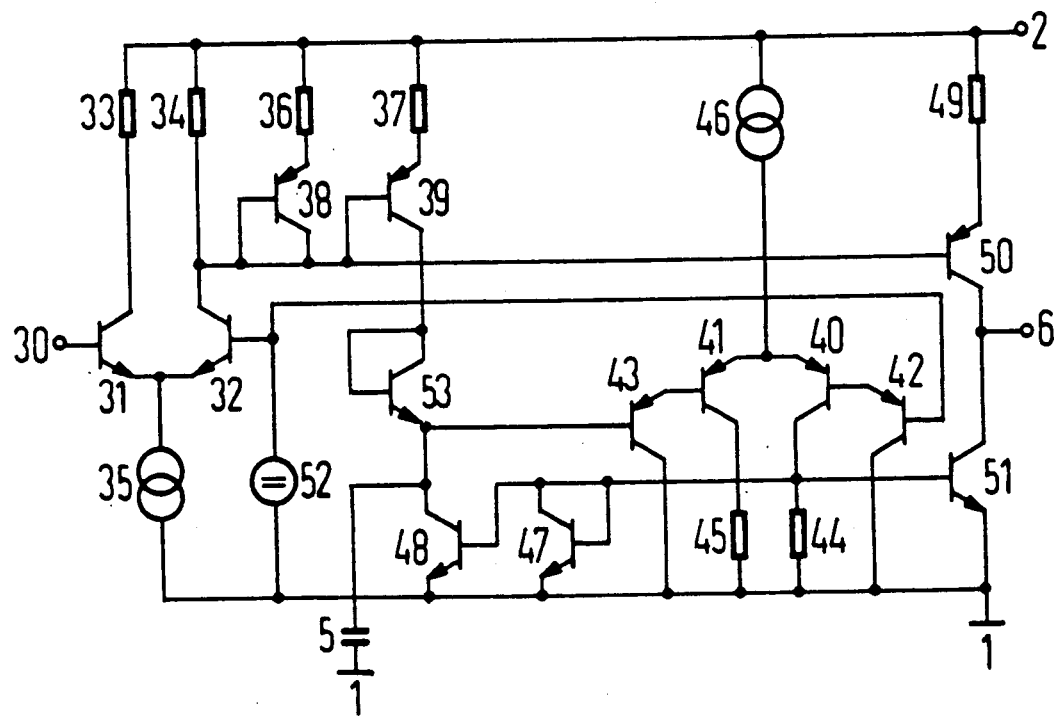
FIG. 3 is a modified form of the filter circuit of FIG. 2, with high-pass operation.

In the embodiment shown in FIG. 3, the voltage-controlled current source 21 and the voltage-controlled current sink 22 of FIG. 2 are each constructed as a differential amplifier with a current mirror connected to the output side. A first differential amplifier includes two emitter-coupled npn transistors 31, 32, a current sink 35 connected between the reference potential 1 and coupled emitters of the transistors, and two collector resistors 33, 34. The base of the transistor 31 of the first differential amplifier is provided as an input 30 of the filter circuit. The base of the other transistor 32 is connected to one pole of a reference voltage source 52 which leads to the reference potential 1, and the collector thereof is connected to the input of a first current mirror. The current mirror includes an input branch having a pnp transistor 38, which is connected as a diode in the conducting direction and has an emitter resistor 36, and an output branch having a further pnp transistor 39 with an emitter resistor 37. The emitter resistors 36, 37 and the collector resistors 33, 34 are all connected to a supply potential 2. The base of the pnp transistor 39 together with the base and the emitter of the pnp transistor 38, are connected to the collector of the npn transistor 32. According to a feature of the invention, the collector of the pnp transistor 39 is connected through an npn transistor 53 which is connected as a diode in the conducting direction, to the capacitor 5 leading to the reference potential 1. The output branch of a second current mirror, which is formed by the collector-to-emitter path of an npn transistor 48, is connected in parallel with the capacitor 5. The input branch of the second current mirror has an npn transistor 47 which is connected as a diode in the conducting direction and connects the base of the npn transistor 48 to the reference potential 1. The collector of the npn transistor 48 is connected to the base of a pnp transistor 43 forming one input of the second differential amplifier. The collector of the pnp transistor 43 is connected to the reference potential 1. The second differential amplifier includes two emitter-coupled pnp transistors 40, 41, which are supplied from the supply potential 2 by means of a current source 46. Each of the transistors 40, 41 has a collector resistor 44, 45 leading to the reference potential 1. The emitter-to-collector path of the pnp transistor 43 is connected between the base of the pnp transistor 41 and the reference potential 1. In the same manner, the emitter-to-collector path of a pnp transistor 42 is connected between the base of the pnp transistor 40 and the reference potential 1. The base of the pnp transistor 42, like the base of the npn transistor 32, is connected to the reference voltage source 52.

According to a feature of the invention, the subtracting amplifier 13 of FIG. 1 is constructed by an additional output branch of each of the two current mirrors and by joining the two additional output branches to make one common output 6. To this end, firstly the base-to-emitter path of an npn transistor 51 is connected parallel to the base-to-emitter path of the npn transistor 48, and secondly the base of a pnp transistor 50 is connected to the base of the pnp transistor 39. The emitter of the transistor 50 is connected through an emitter resistor 49 to the supply potential 2. The collectors of the pnp transistor 50 and npn transistor 51 are joined together and form the output 6.

The functioning of a fundamental embodiment in accordance with FIG. 1 is based on the fact that the capacitor 5 provided for setting the limit frequency is acted upon by an input current that is proportional to the voltage of the signal source 10. As a result, a voltage having a polarity dependent on the applicable current direction builds up at the capacitor 5. At the same time, however, the capacitor 5 is supplied with a opposed current in phase opposition to the input current and proportional to the voltage applied to it, and this opposed current causes a decrease in the voltage applied to the capacitor 5 until the attainment of a state of equilibrium, in which the two currents cancel one another out. Since the capacitor 5, like capacitors in general, has a higher impedance at low frequencies than at high frequencies, the voltage dropping at it, resulting from the difference between the input current and the opposed current, is lower at high frequencies than at low frequencies. The low-pass-filtered input signal is thus present at the output 4. The amplifier 14 preferably serves to adapt the impedance in this case, but it can also be additionally used to increase the basic amplification of the filter. Since current impressing means in general, or in other words voltage/current converters, current sources, current sinks and current mirrors, have a high internal resistance, and current impressing means can be made by integrated technology at considerably less expense than high-impedance resistors, lower capacitances are needed for setting the limit frequency in a filter according to the invention.

If the high-pass-filtered signal according to the invention is subtracted from the input signal by means of the subtracting amplifier 13 as shown in FIG. 1, or vice versa, the result is a high-pass-filtered input signal present at the output 3. The advantages of this operation are that even with high-pass filtering, only low capacitances and only one additional terminal for the capacitor 5 are needed for setting the limit value.

In addition to a bipolar version of the voltage/current converters 11, 12 of FIG. 1, a unipolar version is shown in FIG. 2. In this version, a voltage-controlled current source 21 for charging the capacitor 5 and a voltage-controlled current sink 22 for discharging it are provided, for instance. The signal appearing at the output 7 is equivalent to the low-pass-filtered input signal. Additionally, a unipolar embodiment of the voltage/current converters has the advantage of costing less for circuitry.

In FIG. 3, the current source 21 or current sink 22 of FIG. 2 are constructed as a combination of a differential amplifier and a current mirror, and supply the capacitor 5 from the supply potential 2 or the reference potential 1. By expanding each of the current mirrors by one additional output branch and by joining them to make the common output 6 of the filter circuit, the subtraction of the currents dependent on the input voltage and on the voltage at the capacitor 5 takes place in the output branches of the respective current mirrors. Thus a subtracting amplifier is advantageously constructed at low expense, since in the exemplary embodiment shown in FIG. 3, only two transistors 50, 51 and one resistor 49 are additionally needed, and the high-pass-filtered input signal is present at the output of this subtracting amplifier, forming the output 6 of the filter circuit. According to a feature of the invention, in order to prevent reverse currents from flowing into the output branch of the first current mirror formed by the transistor 39 when the capacitor 5 is charged, the collector of the transistor 39 is connected to the capacitor 5 through the transistor 53 which is connected as a diode in the conducting direction.

In closing it should be noted that in the exemplary embodiment of FIG. 3, the supply potential 2 has a positive polarity as compared with the reference potential 1. A negative polarity is obtained if transistors of the opposite conduction type are used. Moreover, a realization using MOS technology is equally possible.

We claim:

1. Integratable filter circuit, comprising a first voltage/current converter having a control input and an output, a signal source coupled to the control input of said first voltage/current converter, a second voltage/current converter having a control input and an output, the outputs of said voltage/current converters fed to a first terminal of a capacitor in phase opposition to one another and to the control input of said second voltage/current converter, a second terminal of said capacitor coupled to a reference potential, and an amplifier being coupled to the first terminal of said capacitor and having an output forming a filter output.

2. Integratable filter circuit according to claim 1, including a subtracting amplifier coupled to the first terminal of said capacitor and to said signal source, said subtracting amplifier having an output forming a further filter output.

3. Integratable filter circuit according to claim 1, wherein said first voltage/current converter is constructed as a voltage-controlled current source, and said second voltage-controlled current converter is constructed as a voltage-controlled current sink.

4. Integratable filter circuit according to claim 3, wherein said voltage-controlled current source includes a first differential amplifier having an output side and a first current mirror having an input connected to said output side of said first differential amplifier; said voltage-controlled current sink includes a second differential amplifier with an output side and a second current mirror having an input connected to said output side of said second differential amplifier; said first differential amplifier and said second current mirror having transistors of one conduction type; and said second differential amplifier and said first current mirror having transistors of the other conduction type; and said first and second current mirrors have outputs forming the outputs of said voltage/current converters.

5. Integratable filter circuit according to claim 4, including a respective additional output branch coupled to the inputs of said current mirrors, and a common output joined to said additional output branches.

6. Integratable filter circuit according to claim 3, including a diode connected to the output of said voltage-controlled current source in the conducting direction.

* * * * *